United States Patent
Chang

(10) Patent No.: US 7,245,016 B2
(45) Date of Patent: Jul. 17, 2007

(54) CIRCUIT LAYOUT STRUCTURE

(75) Inventor: Chi Chang, Taipei Hsien (TW)

(73) Assignee: VIA Technologies, Inc., Taipei (TW)

( * ) Notice: Subject to any disclaimer, the term of this patent is extended or adjusted under 35 U.S.C. 154(b) by 316 days.

(21) Appl. No.: 10/711,281

(22) Filed: Sep. 7, 2004

(65) Prior Publication Data

US 2005/0116356 A1    Jun. 2, 2005

(30) Foreign Application Priority Data

Nov. 27, 2003    (TW) .............................. 92133284 A

(51) Int. Cl.
*H01L 23/48* (2006.01)

(52) U.S. Cl. ................ 257/758; 257/776; 257/773; 257/786; 257/E23.141; 257/E23.142; 257/E23.143; 257/E23.151; 257/E23.152

(58) Field of Classification Search ................ 257/758, 257/776, 773, E23.141, E23.142, E23.143, 257/E23.151, E23.152, E23.153, 786

See application file for complete search history.

(56) References Cited

U.S. PATENT DOCUMENTS 5,446,243 A  *  8/1995   Crowder et al. ............ 174/250
6,489,689 B2 * 12/2002   Nojiri .......................... 257/786
6,759,329 B2 *  7/2004   Cheng et al. ............... 438/666
2003/0011073 A1 *  1/2003   Shinogi et al. ............. 257/758

* cited by examiner

*Primary Examiner*—Kenneth Parker
*Assistant Examiner*—Mohammad Timor Karimy
(74) *Attorney, Agent, or Firm*—Jiang Chyun IP Office

(57) ABSTRACT

A circuit layout structure for a chip is provided. The chip has a bonding pad area, a nearby device area, and a substrate. The circuit layout structure essentially comprises a plurality of circuit layers, a plurality of dielectric layers and a plurality of vias. The circuit layers are sequentially stacked over the substrate. Each dielectric layer is sandwiched between a pair of adjacent circuit layers. The vias pass through the dielectric layers and electrically connect various circuit layers. The farthest circuit layer away from the substrate has pluralities of bonding pads within the bonding pad area. The bonding pads near the device area overstrides at least one non-signed circuit layer through the furthest circuit layer away from the substrate and electrically connects to a circuit layer nearer the substrate with vias. The circuit layout structure can avoid a direct conflict of signals between the power/ground circuits and the signal circuits.

9 Claims, 4 Drawing Sheets

CIRCUIT LAYOUT STRUCTURE

CROSS REFERENCE TO RELATED APPLICATIONS

This application claims the priority benefit of Taiwan application Ser. No. 92133284, filed on Nov. 27, 2003.

BACKGROUND OF INVENTION

1. Field of the Invention

The present invention relates to a circuit layout structure. More particularly, the present invention relates to a circuit layout structure with a power circuit and a ground circuit having a sufficient line width to maintain signal integrity during transmission.

2. Description of the Related Art

Due to the rapid development of the electronic industry in recent years, integrated circuit (IC) chips find applications in many areas. To meet the demands of as many customers as possible, semiconductor manufacturers have to increase the level of integration of their IC chips. Hence, the density of input/output terminals in each single chip has to increase correspondingly. In other words, for a conventional wire-bonded chip, either the size of the chip has to be reduced for the same number of signal input/output terminals or the number of signal input/output terminals has to be increased for a chip of a given size. In general, the density of input/output terminals con be increased by dispensing the bonding pads around the active surface of the chip in a multi-tier (three-tier or four-tier) organization.

FIG. 1 is a top view of a section of a conventional circuit layout structure on a chip. FIG. 2 is a cross-sectional view along line I–I' of FIG. 1. As shown in FIGS. 1 and 2, the chip 50 has a bonding pad area A1 and a nearby device area A2. The chip 50 further comprises a substrate 60 and a circuit layout structure 100. The circuit layout structure 100 essentially comprises a plurality of circuit layers (M1, M2, ..., M6), a plurality of dielectric layers 110, and a plurality of vias 120. The circuit layers M1, M2, ..., M6 sequentially stacking over the substrate 60. The dielectric layers 110 sandwiching between adjacent circuit layers M1, M2, ..., M6. The vias 120 passing through the dielectric layers 110 and electrically connect to various circuit layers (M1, M2, ..., M6).

The sixth circuit layer M6 (the topmost layer or the layer farthest from the substrate 60) has a plurality of bonding pads 130~133 within the bonding pad area A1. The bonding pads 130~133 are organized into a plurality of rows including a first bonding pad row R1, a second bonding pad row R2, a third bonding pad row R3, and a fourth bonding pad row R4. In the conventional circuit layer structure 100, the bonding pads 130 and 131 of the first bonding pad row R1 and the second bonding pad row R2 are signal bonding pads. The bonding pads 132 in the third bonding pad row R3 are power bonding pads and the bonding pads 133 in the fourth bonding pad row R4 are ground bonding pads. Furthermore, the bonding pads 130 and 131 in the first bonding pad row R1 and the second bonding pad row R2 respectively are electrically connected to the second and third circuit layers M2 and M3 through a set of vias 120. Similarly, the bonding pads 132 and 133 in the third bonding pad row R3 and the fourth bonding pad row R4 respectively are electrically connected to the fourth and the fifth circuit layers M4 and M5 through another set of vias 120. Consequently, the power line L1 connecting the boding pads 132 of the third bonding pad row R3 and the ground line L2 connecting the bonding pads 133 of the fourth bonding pad row R4 alternate with the signal line L3 connecting the bonding pads 130 of the first bonding pad row R1 in area S1 and alternate with the signal line L4 connecting the bonding pads 131 of the second bonding pad row R2 in area S2.

FIG. 3 is a cross-sectional view along line II–II' of FIG. 2. As shown in FIGS. 2 and 3, the power lines L1 and the ground line L2 alternate with the signal line L4 on the left side area S2. Meanwhile, the power line L1 and the ground line L2 alternate with another signal line L3 on the right side area S1. Thus, the line width of the power line L1, the ground line L2, the signal lines L3 and L4 is subjected to some limitations so that the circuit layout of the power line L1 and the ground line L2 is more complicated.

Because the power line and the ground line alternates with the signal line, a portion of the power line and ground line must be narrowed to make way for the passage of the signal line. Yet, the power line and the ground line must have a substantial cross-sectional area for the passage of current. Without increasing the size of a chip, the narrower section in areas where the signal lines alternate with the power line and the ground line in a conventional circuit layout structure is bound to compromise the signal transmission integrity of the chip.

SUMMARY OF INVENTION

Accordingly, at least one objective of the present invention is to provide a circuit layout structure for preventing the power line and the ground line within the bonding pad area of a chip from alternating with the signal line. Hence, complexity of the circuit layout structure is reduced and electrical performance of the chip is improved.

To achieve these and other advantages and in accordance with the purpose of the invention, as embodied and broadly described herein, the invention provides a circuit layout structure for a chip. The chip has a bonding pad area, a nearby device area and a substrate. The circuit layout structure mainly comprises a plurality of circuit layers, a plurality of dielectric layers, and a plurality of vias. The circuit layers are sequentially stacked over the substrate. The dielectric layers are sandwiched between pairs of neighboring circuit layers. The vias pass through the dielectric layer and electrically connect to various circuit layers. Furthermore, the circuit layer furthest from the substrate has a plurality of bonding pads within the bonding pad area. The bonding pads near the device area overstride at least one non-signal circuit layer through the farthest circuit layer away from the substrate and electrically connects to a circuit layer nearer to the substrate with vias.

In the circuit layout structure of present invention, the bonding pads close to the device area overstride the non-signal circuit layer through the top circuit layer before electrically connecting the circuit layer close to the substrate. Hence, the alternating of the power/ground line with the signal line in the bonding pad area can be avoided. In other words, the present invention is able to increase the line width of the power line and the ground line and provide a sectional area large enough for the flow of current for the same circuit wiring area so that signals can be transmitted with integrity. In the meantime, because the power line and the ground line have a sufficient line width, the number of power bonding pads and ground bonding pads con be reduced to decrease the size of the chip.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
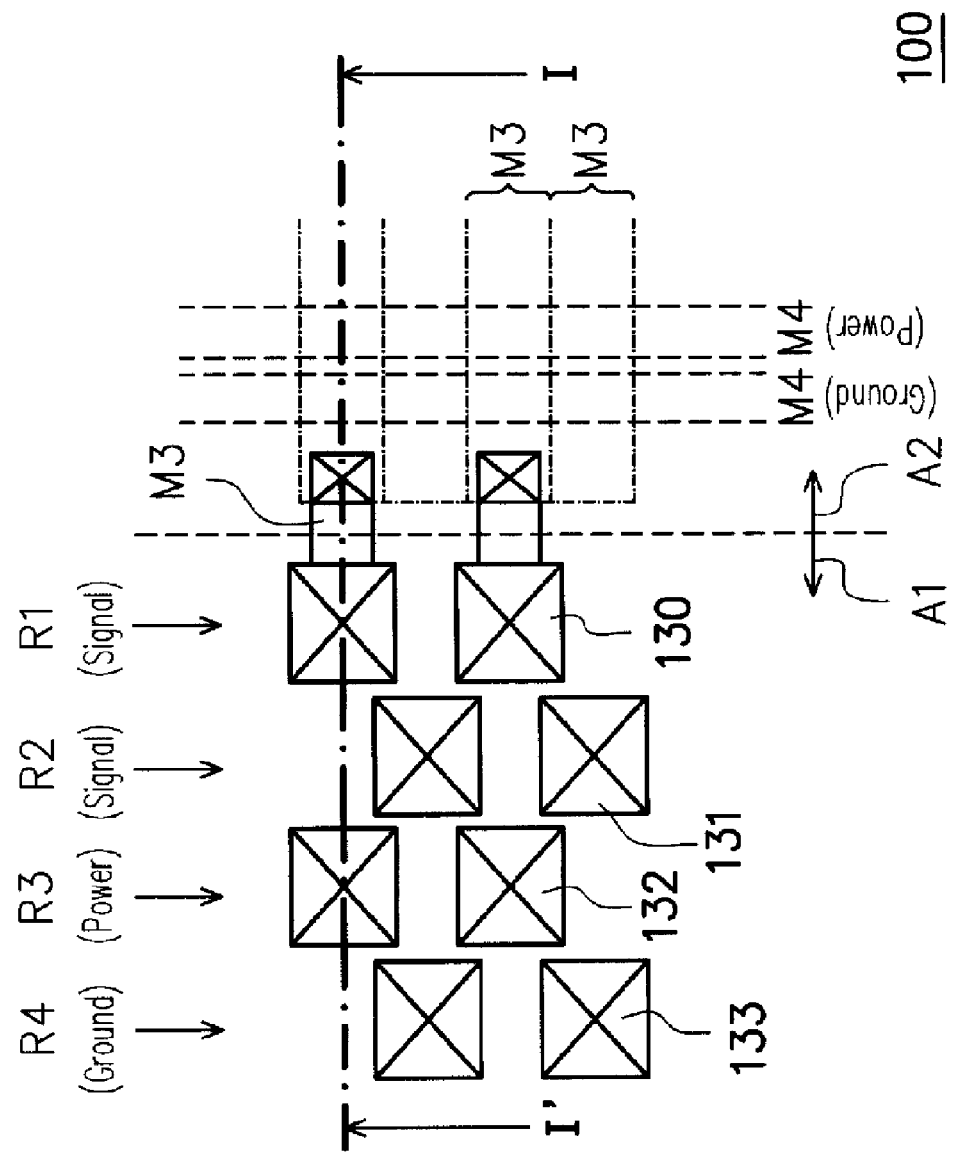
FIG. 1 is a top view of a section of a conventional circuit layout structure on a chip.
Figure 2:
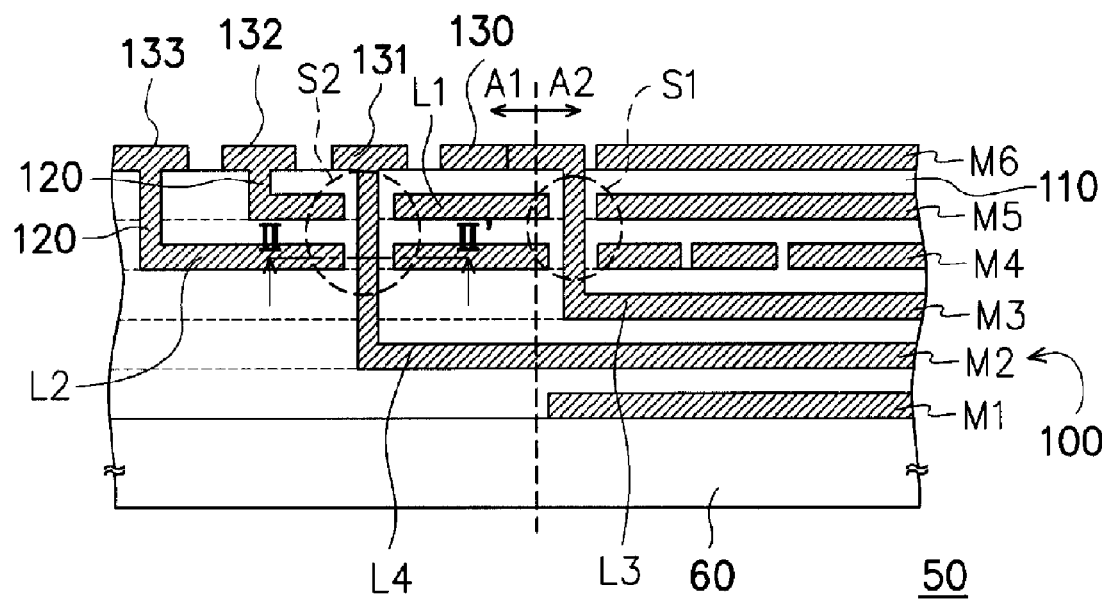
FIG. 2 is a cross-sectional viewalong line I–I' of FIG. 1.
Figure 3:
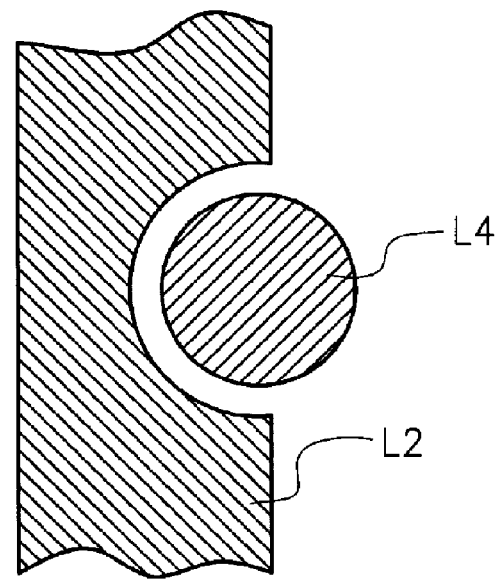
FIG. 3 is a cross-sectional view along line II–II' of FIG. 2.

Reference will now be made in detail to the present preferred embodiments of the invention, examples of which are illustrated in the accompanying drawings. Wherever possible, the same reference numbers are used in the drawings and the description to refer to the same or like parts.

Figure 4:
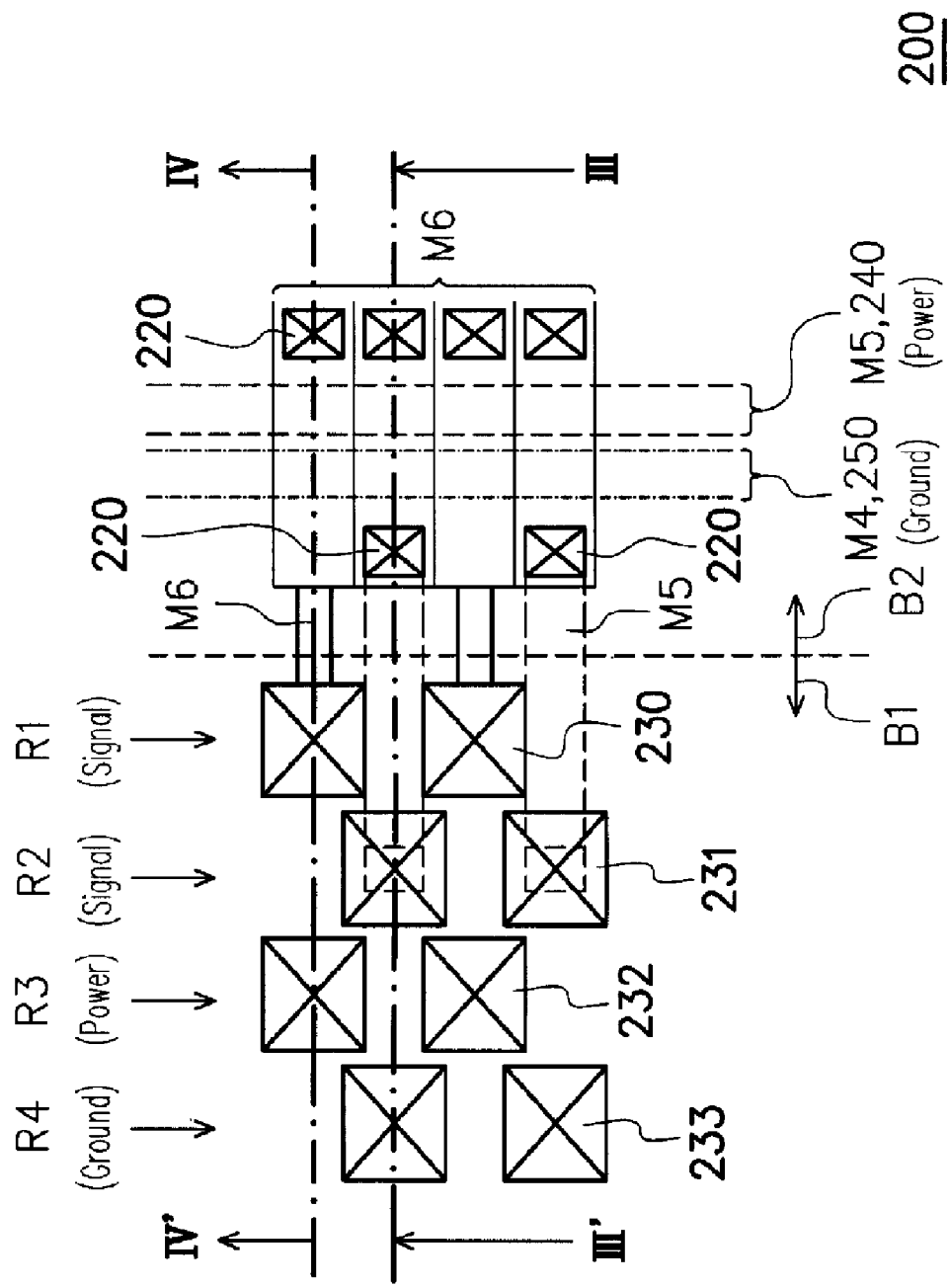
FIG. 4 is a top view of a section of a circuit layout structure on a chip according to one preferred embodiment of this invention.
Figure 5:
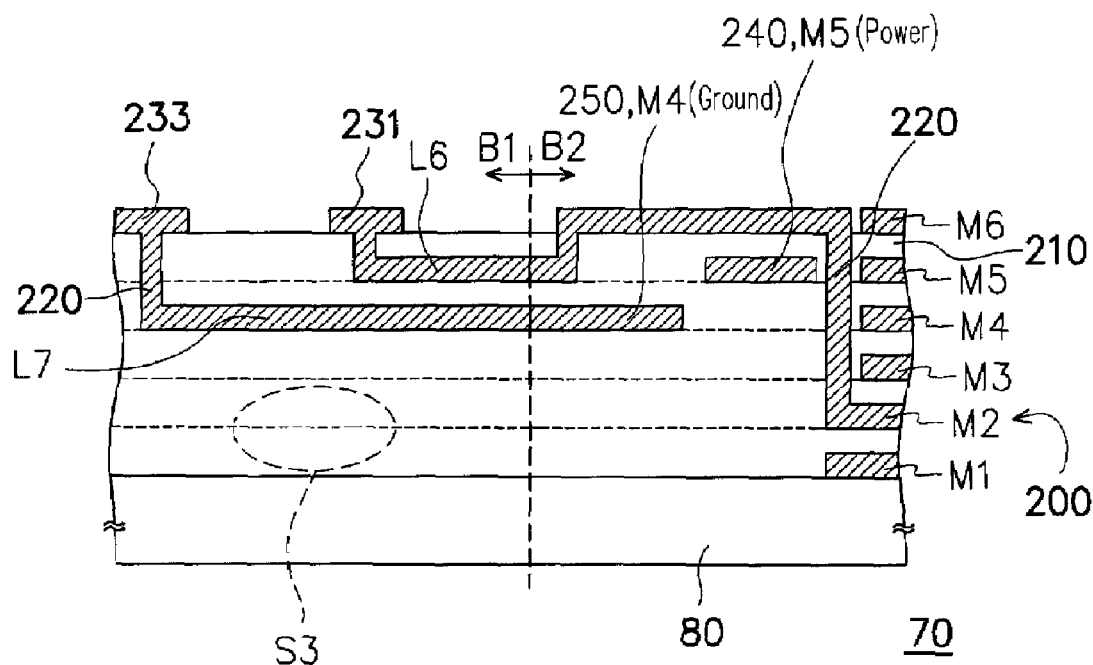
FIG. 5 is a cross-sectional view along line III–III' of FIG. 4.
Figure 6:
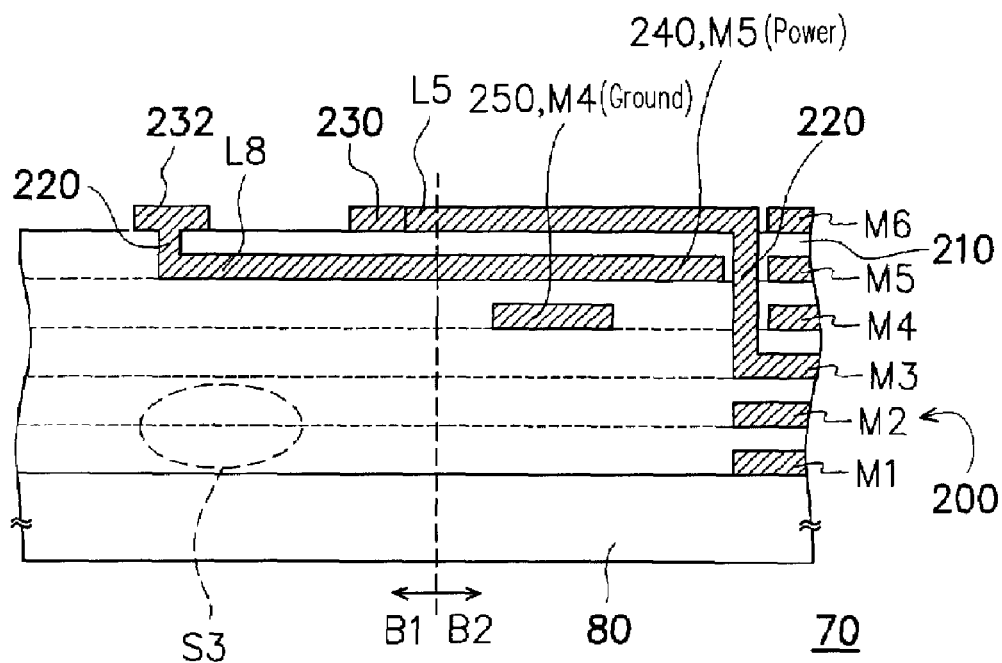
FIG. 6 is a cross-sectional view along line IV–IV' of FIG. 4.

FIG. 4 is a top view of a section of a circuit layout structure on a chip according to one preferred embodiment of this invention. FIG. 5 is a cross-sectional view along line III–III' of FIG. 4. FIG. 6 is a cross-sectional view along line IV–IV' of FIG. 4. A circuit layout structure 200 on a substrate 80 is shown in FIGS. 4, 5, and 6. The circuit layout structure 200 is fabricated on a chip 70. The chip 70 has a centered bonding pad area B1 and an adjacent peripheral device area B2. The circuit layout structure 200 mainly comprises a plurality of circuit layers (M1, M2, . . . , M6), a plurality of dielectric layers 210, and a plurality of vias 220. The circuit layers M1, M2, . . . , M6 are sequentially stacked over the substrate 80. For example, the circuit layers includes a first circuit layer M1, a second circuit layer M2, a third circuit layer M3, a fourth circuit layer M4, a fifth circuit layer M5 and a sixth circuit layer M6. The first circuit layer M1 is closest to the substrate 80. The dielectric layers 210 are respectively sandwiched between pairs of neighboring circuit layers M1, M2, . . . , M6. The vias 220 pass through the dielectric layers 210 and electrically connect with various circuit layers M1, M2, . . . , M6.

The circuit layer farthest from the substrate 80 (the sixth circuit layer M6) has a plurality of bonding pads 230~233 formed within the bonding pad area B1. It should be noted that the bonding pads (for example, the bonding pads 231 in FIG. 5) close to the device area B2 are electrically connected to a circuit layer (for example, the second circuit layer M2) close to the substrate 80 via the fifth circuit layer M5, the sixth circuit layer M6 and a via 220. Similarly, the bonding pad 230 in FIG. 6 is electrically connected to a circuit layer (for example, the third circuit layer M3) close to the substrate 80 via the sixth circuit layer M6 directly. In addition, the bonding pads 230~233 can be grouped into a first bonding pad row R1, a second bonding pad row R2, a third bonding pad row R3, and a fourth bonding pad row R4. The bonding pads 230 and 231 of the first bonding pad row R1 and the second bonding pad row R2 can be signal bonding pads. Meanwhile, the bonding pads 232 and 233 of the third bonding pad row R3 and the fourth bonding pad row R4 can be non-signal bonding pads such as power bonding pads or ground bonding pads. For example, the bonding pads 233 can be ground bonding pads, and the bonding pads 232 can be the power bonding pads.

As shown in FIGS. 4, 5 and 6, the circuit layout structure 200 further comprises a power ring 240 and a ground ring 250 (only a portion of the two is shown). The power ring 240 is constructed from the fifth circuit layer M5 within the device area B2, and the ground ring 250 is constructed from the fourth circuit layer M4 within the device area B2.

The line III–III' in FIG. 4 cut through the second and the fourth bonding pad row R2, R4 so that their corresponding wiring layout of the second and fourth circuit layer M2, M4 con be observed in FIG. 5. A signal line L6 connected to the bonding pad 231 of the second bonding pad row R2 enters the device area B2 and runs on the topmost circuit layer (the sixth circuit layer M6). Hence, the signal line L6 overstrides the power ring 240 and the ground ring 250 in the fourth and the fifth circuit layers M4, M5. Thereafter, the signal line L6 is electrically connected to the second circuit layer M2 through a via 220. Thus, the signal line is prevented from alternating with the power line or the ground line. Similarly, the ground line L7 connected to the bonding pad 233 of the fourth bonding pad row R4 is electrically connected to the ground ring 250 via the fourth circuit layer M4.

The line IV–IV' in FIG. 4 cut through the first and the third bonding pad row R1, R3 so that their corresponding wiring layout of the first and third circuit layer M3, M5 con be observed in FIG. 6. A signal line L5 connected to the bonding pad 230 of the first bonding pad row R1 enters the device area B2 and runs on the topmost circuit layer (the sixth circuit layer M6). Hence, the signal line L5 overstrides the power ring 240 and the ground ring 250 in the fourth and the fifth circuit layers M4, M5. Thereafter, the signal line L5 is electrically connected to the third circuit layer M3 through a via 220. Thus, the signal line is prevented from alternating with the power line or the ground line. Similarly, the power line L8 connected to the bonding pad 232 of the third bonding pad row R3 is electrically connected to the power ring 240 via the fifth circuit layer M5.

Furthermore, the circuit layout structure 200 according to the present invention also permits the area S3 underneath the power line L8 and the ground line L7 to serve as a disposing place for an electrostatic discharge (ESD) device.

In summary, major advantages of the circuit layout structure according to the present invention includes:

1. The bonding pads close to the device region utilizes the circuit layer farthest from the substrate to overstride at least a non-signal circuit layer before joining with a circuit layer closer to the substrate through a via. Hence, the power line and the ground line will not alternate with the signal line within the bonding pad area of the chip.

2. Because the power line and the ground line never alternate with the signal line, the power line and the ground line have a sufficient line width for maintaining signal transmission integrity.

3. Since the power line and the ground line have sufficient line width, the number of power bonding pads and ground bonding pads need not be increased and hence overall size of the chip con be reduced.

4. A simpler circuit layout design con be used when the power line and the ground line do not alternate with the signal line. Therefore, the space underneath the bonding pads con be used for disposing an electrostatic discharge device.

5. With a simpler circuit layout, time for designing the circuit layer structure and cost for fabricating the chip are reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit layout structure for a chip with a bonding pad area, an adjacent device area, and a substrate comprising:
   a plurality of circuit layers, sequentially stacking over the substrate;
   a plurality of dielectric layers, each sandwiching between a pair of neighboring circuit layers; and
   a plurality of vias, passing through the dielectric layers and electrically connecting various circuit layers,
   wherein the circuit layer farthest from the substrate has a plurality of bonding pads within the bonding pad area and a plurality of signal lines within the device area, the bonding pads and the signal lines are located at a same layer, and the signal lines overstride at least a power/ground ring of the circuit layers within the device area, the bonding pads closest to the device area and the bonding pads next to the closest to the device area connect to the signal lines respectively, and then electrically connect with the circuit layer closer to the substrate through the vias, which passing through the power/ground ring, and then electrically connects with the circuit layer closer to the substrate through the via.

2. The circuit layout structure of claim 1, wherein die bonding pads closest to the device area and the bonding pads next to the closest bonding pads comprise a plurality of signal bonding pads.

3. The circuit layout structure of claim 1, wherein the bonding pad farther away from the device area comprises a plurality of non-signal bonding pads.

4. The circuit layout structure of claim 3, wherein the bonding pads farthest from the device area comprise a ground bonding pad.

5. The circuit layout structure of claim 4, wherein the bonding pads next to the farthest bonding pads from the device area comprise a power bonding pad.

6. The circuit layout structure of claim 1, wherein the circuit layers comprises N circuit layers where N is a natural integer greater than 2, and the first circuit layer of N circuit layers is set on the substrate, a $(N-1)^{th}$ circuit layer is set on a $(N-2)^{th}$ circuit layer, and a $N^{th}$ circuit layer is set on the $(N-1)^{th}$ circuit layer and a part of the $N^{th}$ circuit layer within the device area forms a direct electrical connection with the bonding pad closest to the device area.

7. The circuit layout structure of claim 6, wherein the bonding pad farthest from the device area comprises a ground banding pad such that the ground bonding pad forms a direct electrical connection with the $(N-2)^{th}$ circuit layer.

8. The circuit layout structure of claim 6, wherein the bonding pad next to the farthest bonding pad from the device area comprises a power bonding pad such that the power bonding pad forms a direct electrical connection with the $(N-1)^{th}$ circuit layer.

9. The circuit layout structure of claim 6, wherein the bonding pad next to the closest bonding pad to the device area is electrically connected through the $(N-1)^{th}$ circuit layer to the $N^{th}$ circuit layer within die device area.

* * * * *